(12) United States Patent
Oh et al.

(10) Patent No.: US 10,777,740 B2
(45) Date of Patent: Sep. 15, 2020

(54) PHASE CHANGEABLE MEMORY DEVICE AND SEMICONDUCTOR INTEGRATED CIRCUIT DEVICE INCLUDING THE SAME

(71) Applicant: SK hynix Inc., Gyeonggi-do (KR)

(72) Inventors: Dong Yean Oh, Gyeonggi-do (KR); Chang Soo Woo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/274,796

(22) Filed: Feb. 13, 2019

(65) Prior Publication Data
US 2019/0181335 A1 Jun. 13, 2019

Related U.S. Application Data

(63) Continuation of application No. 14/668,296, filed on Mar. 25, 2015, now abandoned.

(30) Foreign Application Priority Data

Nov. 26, 2014 (KR) .......................... 10-2014-0166605

(51) Int. Cl.
*H01L 45/00* (2006.01)
(52) U.S. Cl.
CPC .............. *H01L 45/06* (2013.01); *H01L 45/04* (2013.01); *H01L 45/1233* (2013.01); *H01L 45/1246* (2013.01); *H01L 45/144* (2013.01); *H01L 45/147* (2013.01); *H01L 45/1675* (2013.01)

(58) Field of Classification Search
CPC ..... H01L 45/06; H01L 45/04; H01L 45/1233; H01L 45/1246; H01L 45/144; H01L 45/147; H01L 45/1675

USPC ............................................................. 257/4
See application file for complete search history.

(56) References Cited

U.S. PATENT DOCUMENTS

| 5,254,382 A | 10/1993 | Ueno et al. | |
| 9,006,700 B2* | 4/2015 | Brightsky | H01L 45/1253 257/2 |
| 9,087,987 B2* | 7/2015 | Krebs | H01L 45/1293 |

FOREIGN PATENT DOCUMENTS

| CN | 101636792 A | 1/2010 |
| CN | 103680617 A | 3/2014 |
| TW | 200935636 | 8/2009 |
| TW | 201112400 | 4/2011 |

OTHER PUBLICATIONS

Office Action issued by State Intellectual Property Office (SIPO) of China dated Feb. 6, 2020.

* cited by examiner

*Primary Examiner* — Cuong Q Nguyen
(74) *Attorney, Agent, or Firm* — IP & T Group LLP

(57) ABSTRACT

A semiconductor integrated circuit device and a fabrication method thereof are disclosed. The resistive memory device includes a lower electrode, a resistive layer formed in a resistance change region on the lower electrode, an upper electrode formed on the resistive layer, and an insertion layer configured to allow a reset current path of the resistive layer, which is formed from the upper electrode to the lower electrode, to be bypassed in a direction perpendicular to or parallel to a surface of the lower electrode.

8 Claims, 18 Drawing Sheets

PHASE CHANGEABLE MEMORY DEVICE AND SEMICONDUCTOR INTEGRATED CIRCUIT DEVICE INCLUDING THE SAME

CROSS-REFERENCES TO RELATED APPLICATION

This application is a continuation of application of U.S. patent application Ser. No. 14/668,296, filed Mar. 25, 2015, titled "Resistive memory device and Fabrication method thereof", which claims priority under 35 U.S.C. 119(a) to Korean application No. 10-2014-0166605, filed on Nov. 26, 2014. The disclosure of each of the foregoing to applications is incorporated by reference in its entirety as set forth in full.

BACKGROUND

1. Technical Field

The inventive concept relates to a semiconductor integrated circuit device, and more particularly, to a resistive memory device and a fabrication method thereof.

2. Related Art

With the rapid development of IT technology, next-generation memory devices with ultra-high speed, large capacity, or the like, which are suitable for mobile information communication systems and apparatuses for wirelessly processing large capacity of information, are needed. The next-generation memory devices require nonvolatile characteristics of general flash memory devices, high-speed operation characteristics of static random access memories (SRAMs), and high integration of dynamic RAMs (DRAMs). Additionally, the next generation memory devices need to have lower power consumption. Research has been done comparing devices with good power consumption, good data retention and write/read characteristics with general memory devices, such as ferroelectric RAMs (FRAMs), magnetic RAMs (MRAMs), phase-change RAMs (PCRAMs), or nano floating gate memories. Among the next-generation memory devices, the PCRAMs have a simple structure, can be fabricated in low costs, and operate in high speed. Thus, the PCRAMs are being actively used as the next-generation semiconductor memory devices.

The PCRAMs include a phase-change layer having a crystalline state that is changed according to heat generated by an applied current. A chalcogenide compound Ge—Sb—Te (GST) consisting of germanium (Ge), antimony (Sb), and tellurium (Te) have been mainly used as the phase-change layer applied to the current PCRAMs. The crystalline state of the phase-change layer such as GST is changed by the heat generated according to the intensity and application time of the applied current. The phase-change layer has high resistivity in an amorphous state and low resistivity in a crystalline state. Thus, the phase-change layer may be used as a data storage media of memory devices.

The phase-change of the phase-change layer from the amorphous state to the crystalline state is relatively easy due to the crystallization characteristic thereof, but a large amount of current is necessary to phase-change the phase-change layer from the crystalline state to the amorphous state. Efforts to reduce the reset current in the current PCRAMs are continuing.

SUMMARY

According to an embodiment, there is provided a resistive memory device. The resistive memory device may include a resistive layer serving as a primary current path and an insertion layer as a bypass current path in a reset mode. The insertion layer may have a resistance value smaller than that of the resistive layer of an amorphous state and greater than that of the resistive layer of a crystalline state.

According to an embodiment, there is provided a resistive memory device. The resistive memory device may include a lower electrode, a resistive layer formed over the lower electrode and serving as a primary current path; an upper electrode formed over the resistive layer, and an insertion layer serving as a bypass current path between the upper electrode and the lower electrode. The insertion layer includes a vertical insertion layer extending in a direction perpendicular to an upper surface of the lower electrode, a horizontal insertion layer extending in a direction parallel to the upper surface of the lower electrode, or both.

According to an embodiment, there is provided a method of fabricating a resistive memory device. The method may include forming a lower electrode, forming a variable resistor structure including an insertion layer over the lower electrode, and forming an upper electrode over the variable resistor structure. The insertion layer forms a bypass current path in a reset mode and the bypass current path extends in a direction perpendicular to an upper surface of the lower electrode, in a direction parallel to the upper surface of the lower electrode, or both.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 17B is an equivalent circuit diagram of the resistive memory device shown in FIG. 17a;

DETAILED DESCRIPTION

Figure 1:
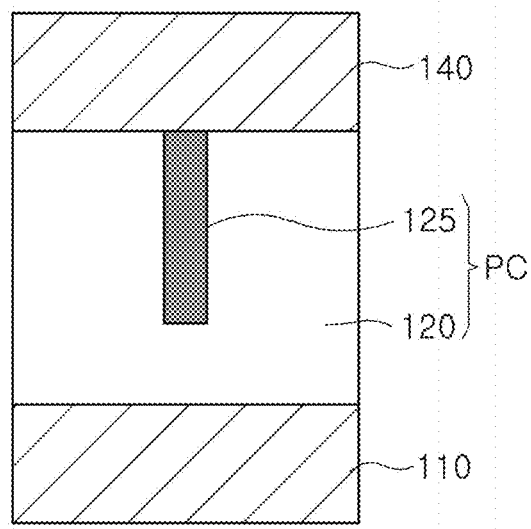
FIG. 1 is a schematic cross-sectional view illustrating a resistive memory device according to an embodiment.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result of, for example, manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

The inventive concept is described herein with reference to cross-section and/or plan illustrations that are schematic illustrations of exemplary embodiments of the inventive concept. However, the embodiments of the inventive concept described should not be construed as limiting the inventive concept. Although several embodiments of the inventive concept will be shown and described, it will be appreciated by those of ordinary skill in the art that changes may be made in these exemplary embodiments without departing from the principles and spirit of the inventive concept.

Figure 2:
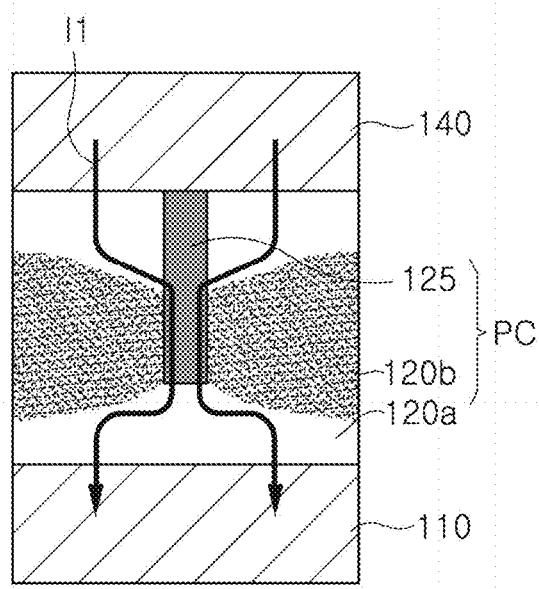
FIG. 2 is a cross-sectional view illustrating current flow in phase-change of the resistive memory device of FIG. 1 to an amorphous state.

Referring to FIGS. 1 and 2, a resistive memory cell may include a lower electrode 110 formed on a base layer (not shown). The base layer may be a layer including a switching device (not shown) or a semiconductor substrate including a switching device (not shown).

A resistive layer 120 having at least one current path may be formed on the lower electrode 110. For example, a resistance change region, that is, a phase change region ("PC"), may be configured to generate at least one current path I1 parallel to or perpendicular to an upper surface of the lower electrode 110 or an upper surface of the resistive layer 120. The resistance change region PC may include the resistive layer 120 and an insertion layer 125 formed in the resistive layer 120. The insertion layer 125 may have a certain width and may be formed in the resistive layer 120 to have a plug shape. In the embodiment, when measured from the upper surface of the resistive layer 120, a thickness, which is a vertical length of the insertion layer 125, may be smaller than that of the resistive layer 120.

The resistive layer 120 may include, for example, a PCMO ($Pr_{1-x}Ca_xMnO_3$) layer wherein x is a number of from about 0.05 to about 0.95 (Examples of stoichiometries for PCMO include, but are not limited to, $Pr_{0.7}Ca_{0.3}MnO_3$, $Pr_{0.5}Ca_{0.5}MnO_3$, and $Pr_{0.67}Ca_{0.33}MnO_3$) for a resistive RAM (ReRAM), a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM). The insertion layer 125 may include a material having a resistance value smaller than that of the resistive layer 120 when the resistive layer 120 is in an amorphous state and greater than that of the resistive layer 120 when the resistive layer 120 is in a crystalline state. The insertion layer 125 may include one of a conductive layer, a nitride material layer having conductivity, and an oxide material layer having conductivity. For example, the insertion layer 125 may include aluminum nitride (AlN), boron nitride (BN), alumina ($Al_2O_3$), tantalum nitride (TaN), tungsten (W), tungsten nitride (WN), cobalt tungsten (CoW), nickel tungsten (NiW), yttrium oxide (YiOx), or a combination thereof.

An upper electrode 140 is formed on the resistance change region (PC).

When a reset voltage for changing the resistive layer 120 into a reset state is applied, a portion of the resistive layer 120 transforms into an amorphous state due to heat applied from the lower electrode 110. Referring to FIG. 2, the resistive layer 120 may have two or more resistive states, for example, a crystalline resistive layer 120a and an amorphous resistive layer 120b. The transformation of the resistive layer 120 into an amorphous state starts from the center of the resistive layer 120 then proceeds outward. As shown in FIG. 2, the amorphization of the resistive layer 120 starts from a central portion of the resistance change region PC, that is, the resistive layer 120 then proceeds gradually outward.

When the current path I1 generated in the resistance change region PC moves along the crystalline resistive layer 120a from the upper electrode 140 in a vertical direction, the current path I1 reaches the amorphous resistive layer 120b. Then the current path I1 takes a bypass formed along the insertion layer 125 having a smaller resistance value than that of the amorphous resistive layer 120b in a horizontal direction. When the current path I1 moving along the insertion layer 125 reaches the crystalline resistive layer 120a again, the current path I1 flows back onto the original current path which is along the crystalline resistive layer 120a that has a smaller resistance value than that of the insertion layer 125.

The current path I1 is changed by the insertion layer 125, and the current amount and a reset resistance may change accordingly. Thus, a ratio (slope) of the resistance of the resistance change region PC to a reset current is changed. That is, an additional resistance level is created which is defined between the set resistance and the reset resistance of the resistive layer 120. Therefore, the resistive memory cell can have multi-level resistance.

Figure 3:
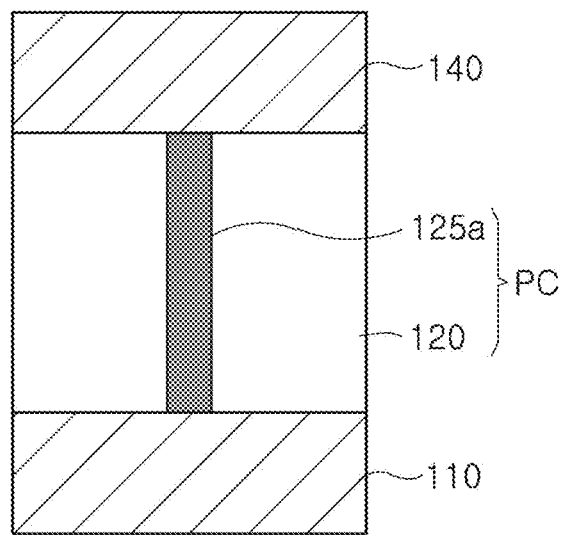
FIG. 3 is a schematic cross-sectional view illustrating a resistive memory device according to an embodiment.
Figure 4:
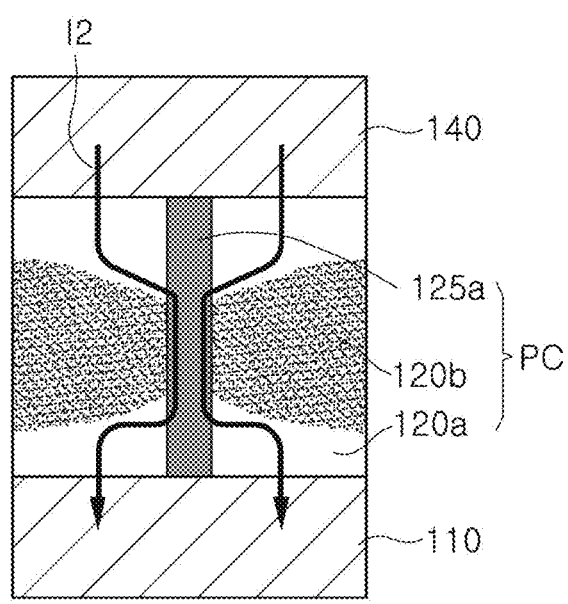
FIG. 4 is a cross-sectional view illustrating current flow in phase-change of the resistive memory device of FIG. 3 to an amorphous state.

Referring to FIGS. 3 and 4, when measured from the upper surface of the resistive layer 120 an insertion layer 125a may have the same depth or vertical length, as the thickness of a resistive layer 120.

Under this structure, when a current path I2 reaches an amorphous resistive layer 120b, the current path I2 may change from the resistive layer 120b to the insertion layer 125a. As a result, a bypass passing through the insertion layer 125a is formed. The insertion layer 125a may be formed to pass through the resistive layer 120.

Figure 5:
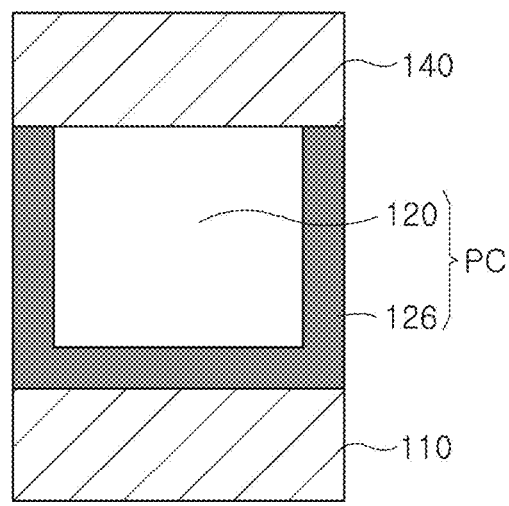
FIG. 5 is a schematic cross-sectional view illustrating a resistive memory device according to an embodiment.

As illustrated in FIG. 5, an insertion layer 126 may be formed in a resistance change region PC, and surround the resistive layer 120.

When a reset voltage for changing the resistance change region PC into a reset state is applied, the amorphization slowly starts from the resistive layer 120 located in the center of the resistance change region PC.

Figure 6:
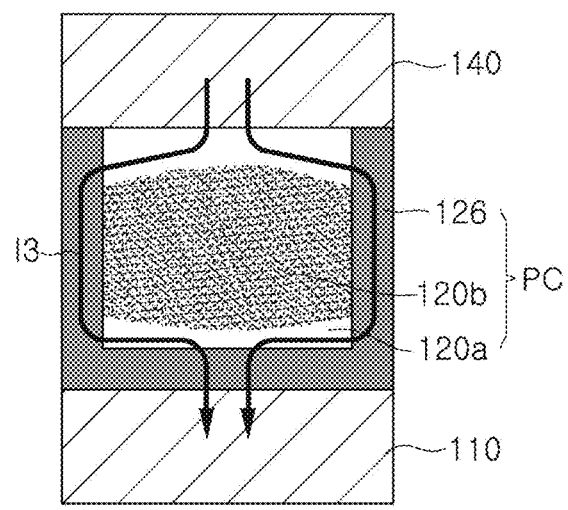
FIG. 6 is a cross-sectional view illustrating current flow in phase-change of the resistive memory device of FIG. 5 to an amorphous state.

As illustrated in FIG. 6, a current path I3 is formed from an upper electrode 140 to the lower electrode 110 through the resistive layer 120 shown in FIG. 5, and the insertion layer 126. Specifically, the current path I3 flows through the crystalline resistive layer 120a. When the current path I3 reaches an amorphous resistive layer 120b, the current path I3 takes a bypass which is formed through the insertion layer 126, rather than staying on the amorphous resistive layer 120b. When the current path I3 moving along the insertion layer 126 reaches a crystalline resistive layer 120a again, the current path I3 returns back to the crystalline resistive layer 120a.

Figure 7:
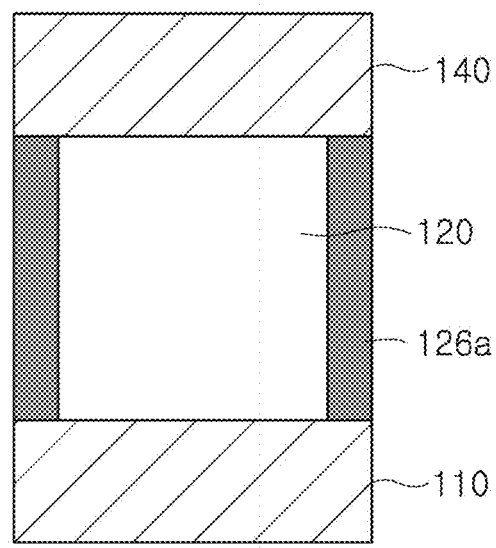
FIG. 7 is a schematic cross-sectional view illustrating a resistive memory device according to an embodiment.
Figure 8:
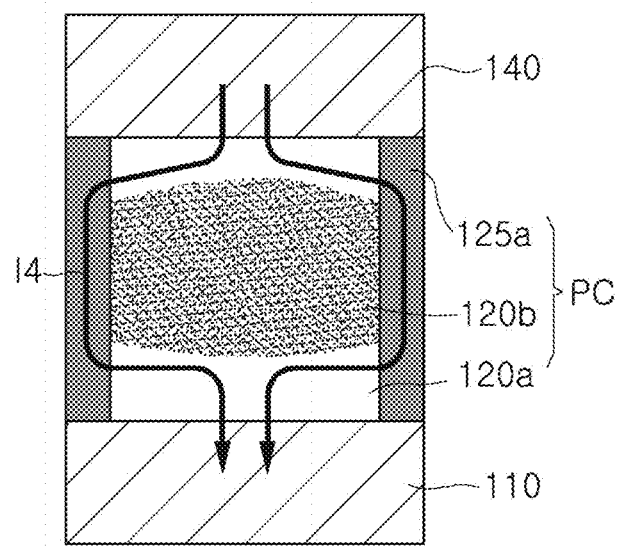
FIG. 8 is a cross-sectional view illustrating current flow in phase-change of the resistive memory device of FIG. 7 to an amorphous state.

Referring to FIG. 7, an insertion layer 126a may surround a resistance change region PC. As illustrated in FIG. 8, when a current path I4 extending from an upper electrode 140 reaches an amorphous resistive layer 120b, the current I4 takes a bypass which is formed along the insertion layer 126a. The insertion layer 126a has a smaller resistance value than that of the amorphous resistive layer 120b. Then, the current I4 flows through the insertion layer 126a. When the current path I4 reaches a crystalline resistive layer 120a again, the current path I4 gets out of the bypass and returns back to the crystalline resistive layer 120a again.

Figure 9:
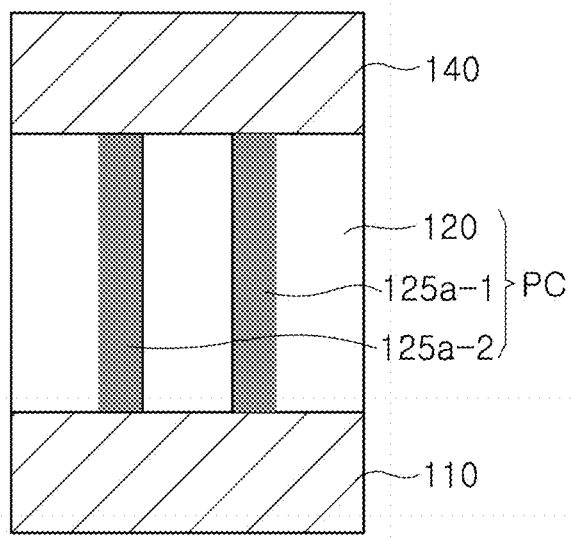
FIG. 9 is a schematic cross-sectional view illustrating a resistive memory device according to an embodiment.
Figure 11:
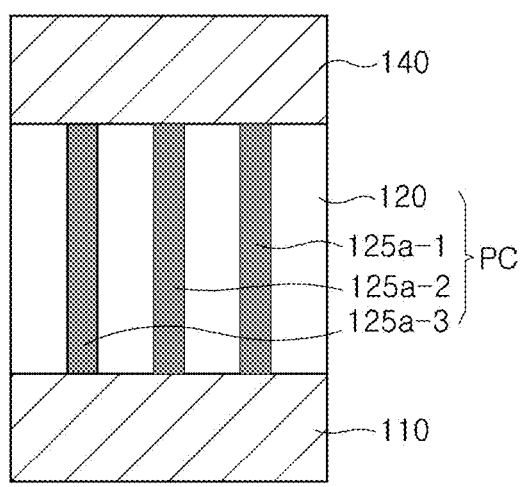
FIG. 11 is a schematic cross-sectional view illustrating a resistive memory device according to an embodiment.

Referring to FIGS. 9 and 11, a plurality of insertion layers 125a-1, 125a-2, and 125a-3 each having a plug shape and each penetrating a resistive layer 120 may be formed in the resistive layer 120.

Figure 10:
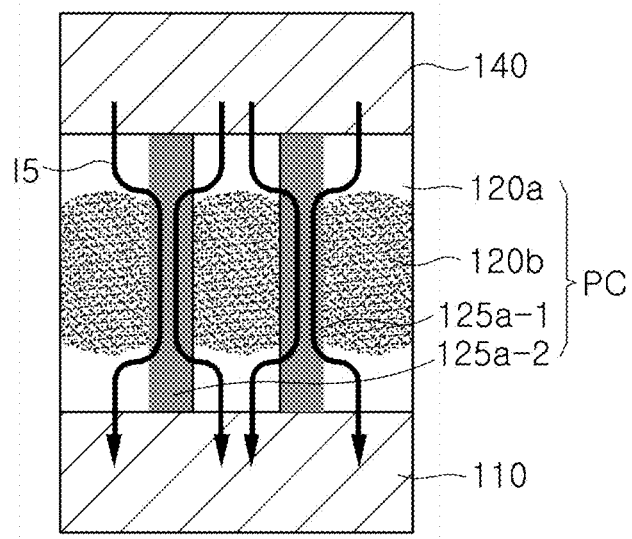
FIG. 10 is a cross-sectional view illustrating current flow in phase-change of the resistive memory device of FIG. 9 to an amorphous state.
Figure 12:
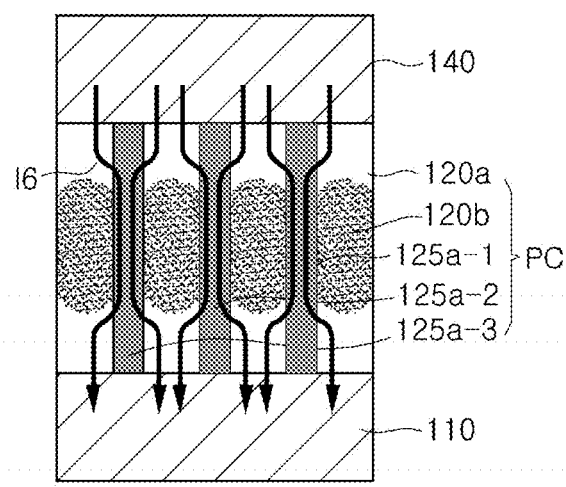
FIG. 12 is a cross-sectional view illustrating current flow in phase-change of the resistive memory device of FIG. 11 to an amorphous state.

Through the formation of the plurality of insertion layers 125a-1, 125a-2, and 125a-3, as illustrated in FIGS. 10 and 12, a plurality of amorphous resistive layers 120b may be formed in one resistance change region PC. Thus, a plurality of current paths I5 and I6 are generated in a horizontal direction and a vertical direction in the resistance change region PC. Due to the various types of current paths I5 and I6, a resistance slope may vary, and a plurality of resistance levels may be obtained.

Figure 13:
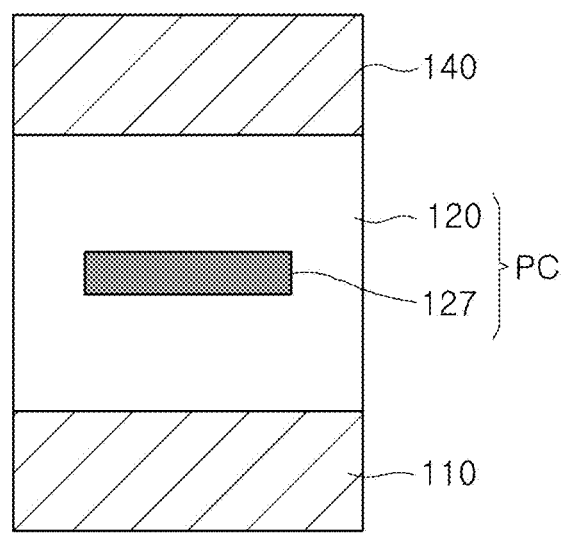
FIG. 13 is a schematic cross-sectional view illustrating a resistive memory device according to an embodiment.
Figure 14:
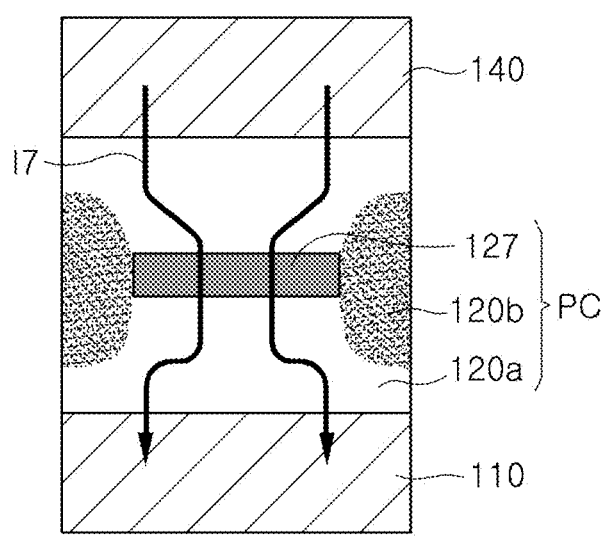
FIG. 14 is a cross-sectional view illustrating current flow in phase-change of the resistive memory device of FIG. 13 to an amorphous state.

Referring to FIG. 13, an insertion layer 127 may be formed in parallel to an upper surface of a lower electrode 110. As illustrated in FIG. 14, through the formation of the insertion layer 127, a current path I7 bypasses an amorphous resistive layer 120b. That is, the current path I7 is formed along the insertion layer 127, rather than along the amorphous resistive layer 120b. Then, the current path I7 is formed through the insertion layer 127 and the crystalline resistive layer 120a.

Figure 15:
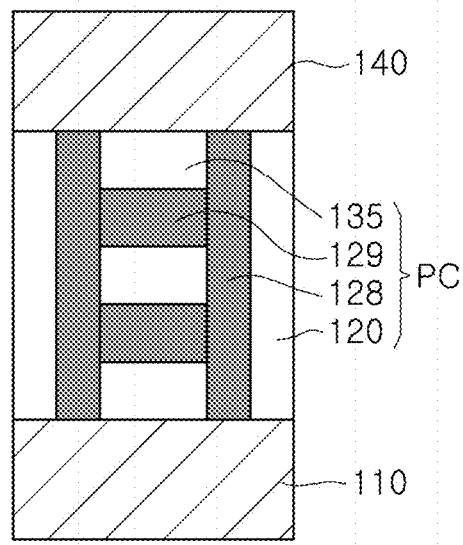
FIG. 15 is a schematic cross-sectional view illustrating a resistive memory device according to an embodiment.

As illustrated in FIG. 15, a resistance change region PC may include a resistive layer 120, a vertical insertion layer 128, and a horizontal insertion layer 129.

The resistive layers 120 may be formed in the resistance change region in a cylinder shape. The vertical insertion layers 128 may be formed between the resistive layers 120 in a cylinder shape. The vertical insertion layers 128 may be formed perpendicular to an upper surface of a lower electrode 110. The horizontal insertion layer 129 may extend between the vertical insertion layers 128. There may be at least one or more horizontal insertion layer 129 which may extend substantially in parallel to the upper surface of the lower electrode 110.

Insulating layers 135 may be interposed between the horizontal insertion layers 129, between the horizontal insertion layer 129 and the lower electrode 110, and between the horizontal insertion layer 129 and an upper electrode layer 140.

In an embodiment, the vertical insertion layer 128 may have substantially the same resistance value as the horizontal insertion layer 129. In another embodiment, the horizontal insertion layer 129 may have a smaller resistance value than the vertical insertion layer 128. For example, when a thickness of the horizontal insertion layer 129 is larger than a width of the vertical insertion layer 128, the vertical insertion layer 128 and the horizontal insertion layer 129 may be formed of the same material. When the thickness of the horizontal insertion layer 129 is equal to the width of the vertical insertion layer 128, the horizontal insertion layer 129 may be formed of a material having a smaller resistance value than the vertical insertion layer 128.

Further, the vertical and horizontal insertion layers 128 and 129 may have resistance values smaller than that of an amorphous resistive layer (see 120b-1 and 120b-2 of FIGS. 16 to 19) and greater than that of a crystalline resistive layer 120a. The vertical and horizontal insertion layers 128 and 129 may be designed in such a manner that in a reset mode current chooses the path through the vertical and horizontal insertion layers 128 and 129 rather than choosing the path through the amorphous resistive layer 120b-1 and 120b-2. As described above, the vertical and horizontal insertion layers 128 and 129 may include one of a conductive layer, a nitride material layer having conductivity, and an oxide material layer having conductivity. For example, the vertical and horizontal insertion layers 128 and 129 may include AlN, BN, $Al_2O_3$, TaN, W, WN, CoW, NiW, YiOx, where x is an integer, or a combination thereof.

Figure 16:
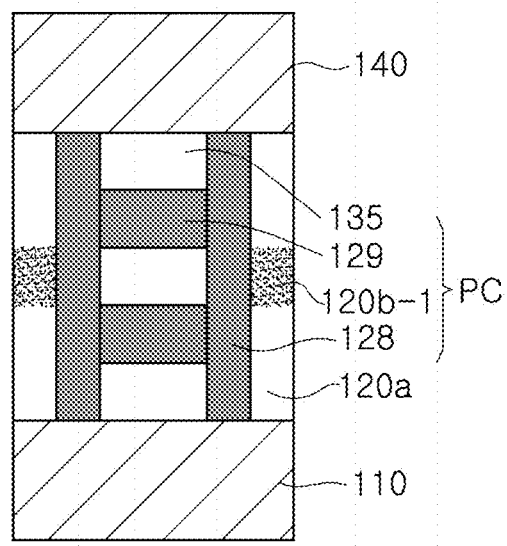
FIG. 16 is a cross-sectional view illustrating a structure of the resistive memory device of FIG. 15 at a state in which the resistive layer is partially transformed into an amorphous state.

As illustrated in FIG. 16, when an initial reset voltage is supplied to the resistive memory cell having the above-described configuration, phase-change starts from a central portion of the resistive layer 120. The amorphous resistive layer 120b-1 is formed according to a supply of the initial reset voltage. The amorphous resistive layer 120b-1 according to the initial reset voltage may occupy a small part of the entire resistive layer 120.

Figure 17A:
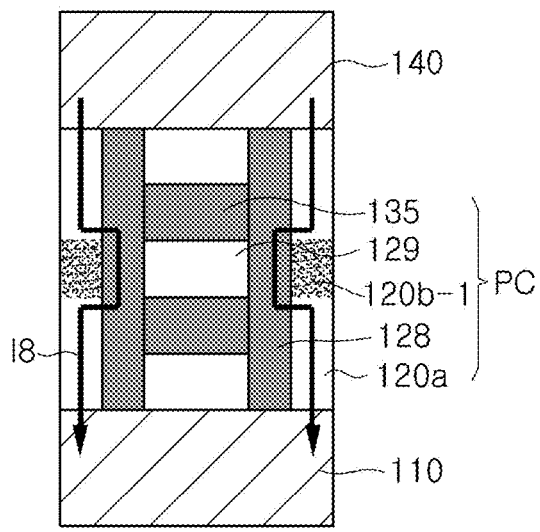
FIG. 17Aa is a cross-sectional view illustrating current flow of the resistive memory device of FIG. 16.
Figure 17B:
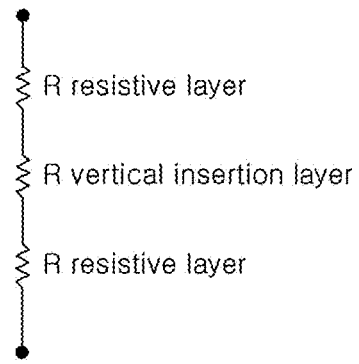

An amorphous layer has a greater resistance value than a crystalline layer. Therefore, as illustrated in FIG. 17A, a current path I8 traveling from the upper electrode 140 toward the lower electrode 110 may move along the crystalline resistive layer 120a and then bypass the initial amorphous resistive layer 120b-1 toward the vertical insertion layer 128 having a relatively small resistance value. Thus, the current path I8 is formed in a vertical insertion layer 128 corresponding to the initial amorphous resistive layer 120b-1. Since the initial amorphous resistive layer 120b-1 occupies a relatively small area in the resistive layer 120 as compared with a length of the entire resistive layer 120, the current path I8 may not be bypassed toward the horizontal insertion layer 129. Rather the current path I8 may return toward the crystalline resistive layer 120a. As the current path I8 is bypassed to the vertical insertion layer 128 having a smaller resistance value than the initial amorphous resistive layer 120b-1, the slope of the resistance according to the current may be varied. An equivalent resistor for the current path I8 is illustrated in FIG. 17B.

Figure 18:
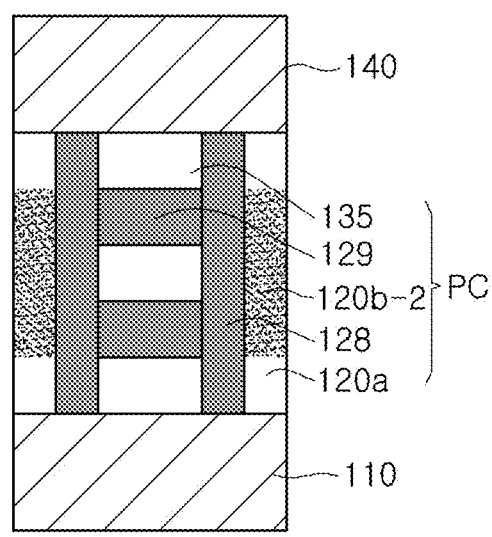
FIG. 18 is a cross-sectional view illustrating a structure of the resistive memory device of FIG. 15 at a state in which the resistive layer is completely transformed into an amorphous state.

As illustrated in FIG. 18, when the reset voltage is sufficiently supplied, the resistive memory cell is completely reset. Thus, most of the resistive layer 120 becomes the amorphous resistive layer 120b-2, and an edge portion of the resistive layer 120 is maintained in the crystalline resistive layer 120a.

Figure 19A:
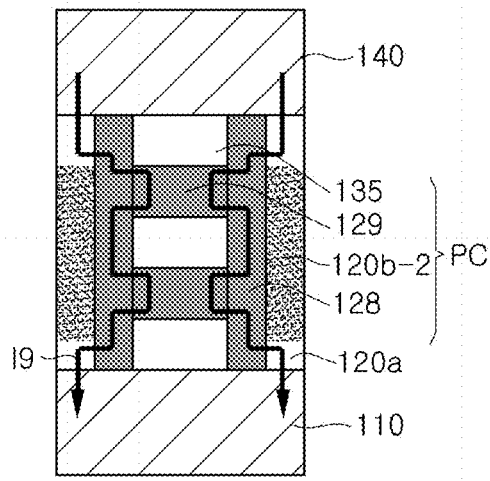
FIG. 19A is a cross-sectional view illustrating current flow of the resistive memory device of FIG. 18.
Figure 19B:
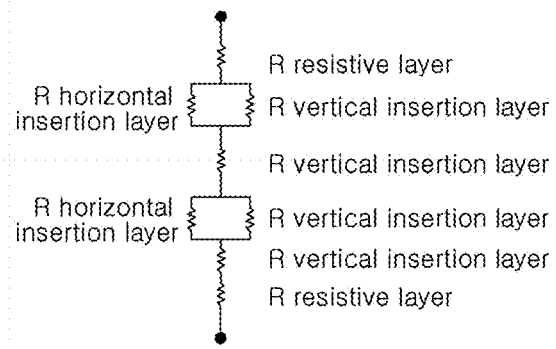
FIG. 19B is an equivalent circuit diagram of the resistive memory device shown in FIG. 19a FIG. 20 is a graph illustrating resistance distribution in a resistive memory cell and a resistance change in a reset mode according to an embodiment.

As illustrated in FIG. 19A, a current path I9 extending from the upper electrode 140 bypasses the amorphous resistive layer 120b-2 and chooses an alternative path passing through the vertical insertion layer 128 and/or the horizontal insertion layer 129 which have a smaller resistance value than the amorphous resistive layer 120b-2. As described above, the current path I9 takes the path passing through the horizontal insertion layer 129 when the resistance value of the horizontal insertion layer 129 is smaller than that of the amorphous resistive layer 120b-2, or when the thickness of the horizontal insertion layer 129 is greater than the width of the vertical insertion layer 128.

Since a length of the current path I9 passing through the insertion layers 128 and 129 is greater than that of the current path I8 of FIG. 17A, the resistance value according to the current and the slope of the resistance value may be varied. An equivalent resistor for the current path I9 is illustrated in the right portion of FIG. 19B. In the complete amorphous state of the resistive layer 120, the length of the current path extending through resistors is longer than in the initial amorphous state. Comparing the current path I8 of FIG. 17A and the current path I9 shown in FIG. 19A, an equivalent resistor path varies as the amorphous state proceeds, and the resistance value varies accordingly.

Figure 20:
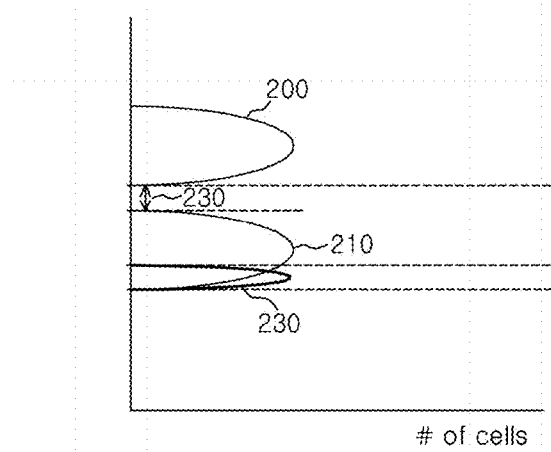
Figure 20:
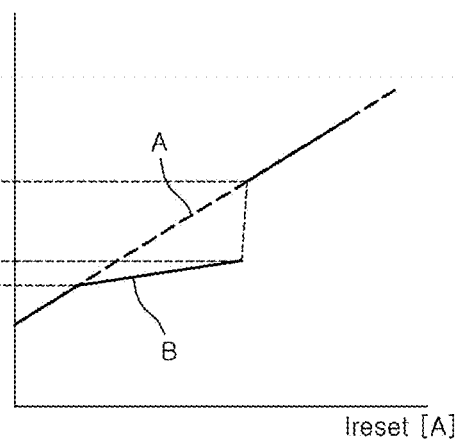

Through the formation of various types of insertion layers, as shown in FIG. 20, resistance distribution of the resistive memory cell and the resistance according to the current may vary. That is, through the formation of the insertion layers capable of forming a current bypass, additional resistance distribution 230 is generated in addition to general resistance distributions 200 (Reset) and 210 (Set). Since the additional resistance distribution 230 has a different peak and amplitude from the general resistance distributions 200 and 210, data for the additional resistance distribution 230 can be read separately and distinctively from resistance distributions 200 and 210. In the right drawing of FIG. 20, "A" indicates the slope of the resistance when the insertion layer is not included, and "B" indicates the slope of the resistance when the insertion layer is included. Therefore, since the current path varies according to the intervention of the insertion layer, the effective resistance value and the slope of the resistance varies.

Figure 21:
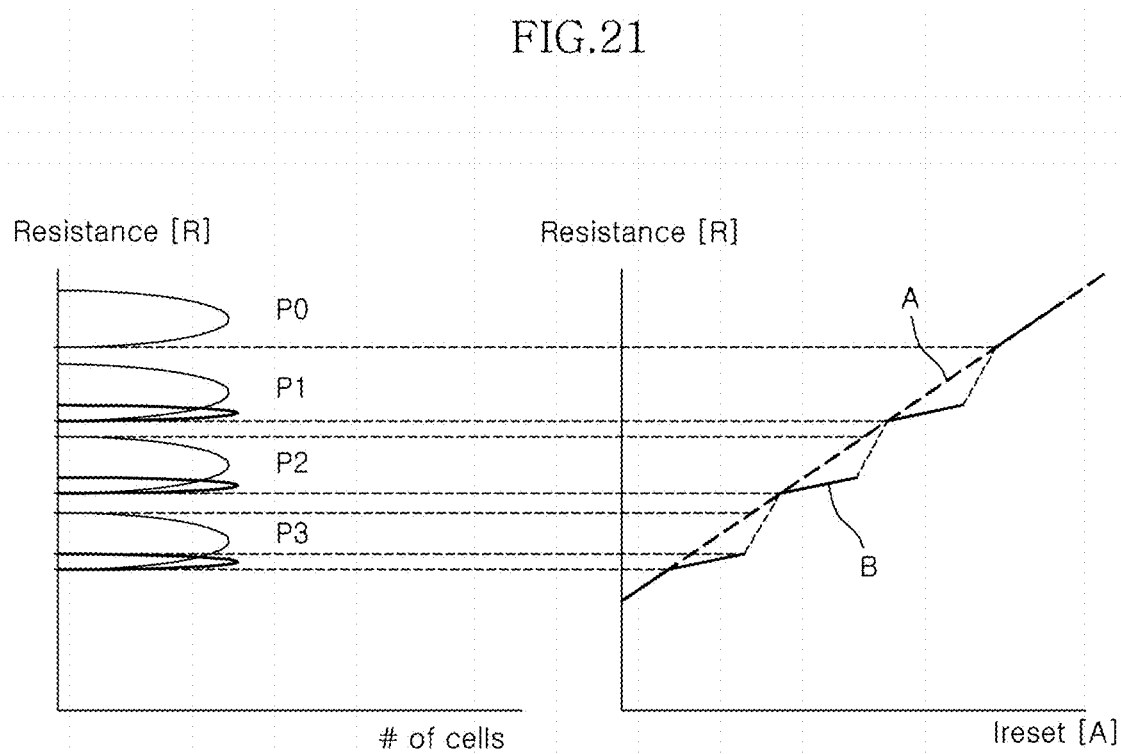
FIG. 21 is a graph illustrating resistance distribution in a resistive memory cell and a resistance change in a reset mode according to another embodiment.

When a plurality of insertion layers are intervened as illustrated in FIGS. 17A to 19B, a plurality of current paths are formed. Therefore, as illustrated in FIG. 21, a plurality of resistance distributions may be formed in addition to resistance distribution P3 (SET) and resistance distribution P0 (RESET). Thus, a multi-level cell may be implemented.

Figure 22:
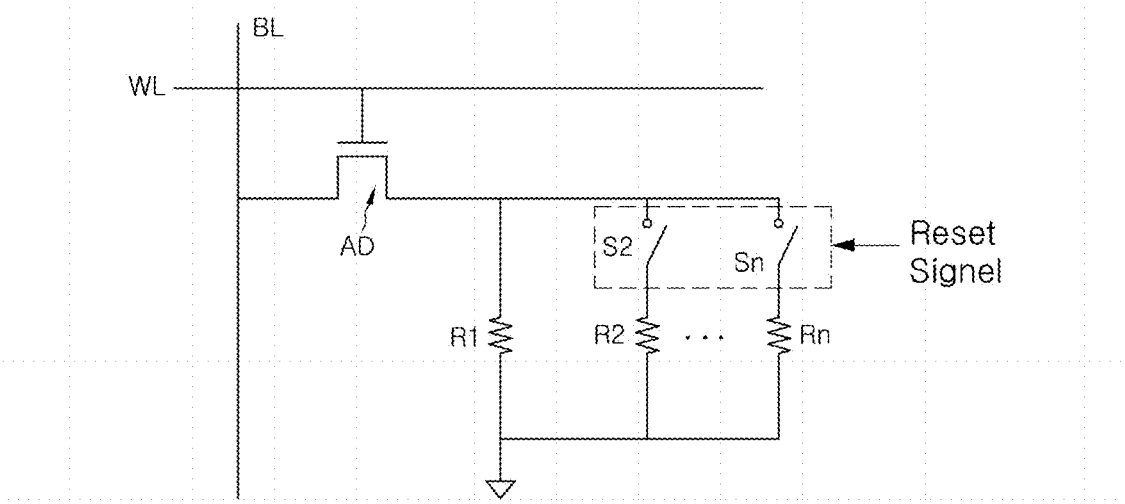
FIG. 22 is an equivalent circuit diagram illustrating a resistive memory cell according to an embodiment.

Furthermore, as shown in FIG. 22 when the various types of insertion layers are intervened as described above, the resistive memory cell may be implemented into an equivalent circuit.

Referring to FIG. 22, the resistive memory cell may include an access device AD coupled to a word line WL and a bit line BL, and a first resistor R1 and a second resistor R2 each coupled to the access device AD. The first resistor R1 may be formed by a resistor of a resistive layer and may substantially store data. The second resistor R2 may be formed by a resistor of at least one insertion layer. Since a resistance value of the resistor R2 may vary according to a type and structure of the insertion layer, the resistor R2 may be configured in various forms. The resistance value in a set state may be determined by a resistance value of a variable resistance material in a crystalline state. The resistance value in a reset state may be determined by a sum of a resistance value of the variable resistance material in an amorphous state and resistance values of the insertion layers. Thus, a resistive memory cell having various resistance distributions and resistance values may be formed.

A method of fabricating a resistive memory device including a plug-shaped vertical insertion layer according to an embodiment will be described with reference to FIGS. 23 to 26.

Figure 23:
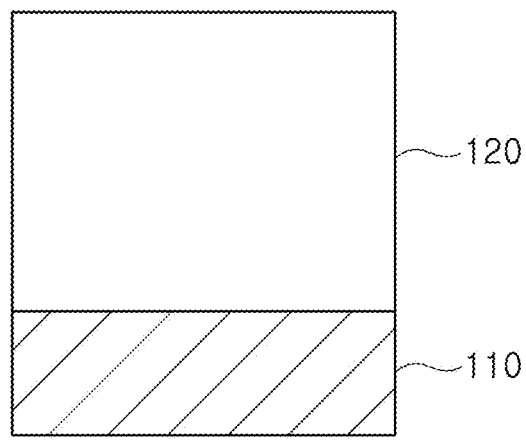
FIGS. 23 to 26 are cross-sectional views illustrating a method of fabricating a resistive memory device according to an embodiment.

Referring to FIG. 23, a lower electrode 110 is formed. A resistive layer 120 is formed on the lower electrode 110.

Figure 24:
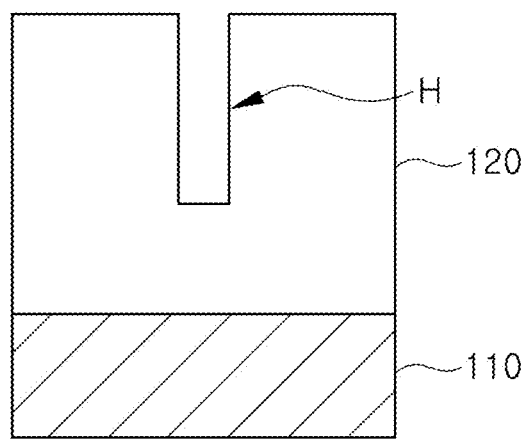

Referring to FIG. 24, a predetermined portion of the resistive layer 120 is etched to form a hole H. The hole H may have a depth smaller than a thickness of the resistive layer 120 when measured from the upper surface of the resistive layer 120, as illustrated in FIG. 1. In another embodiment, the hole H may have a depth equal to the thickness of the resistive layer 120 when measured form the upper surface of the resistive layer 120, as illustrated in FIG. 3. One hole H may be formed per memory cell as illustrated in FIGS. 1 and 3, or a plurality of holes H may be formed per memory cell as illustrated in FIGS. 7, 9, and 11.

Figure 25:
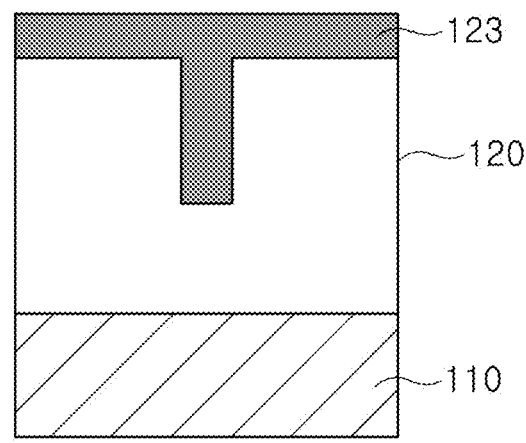
Figure 26:
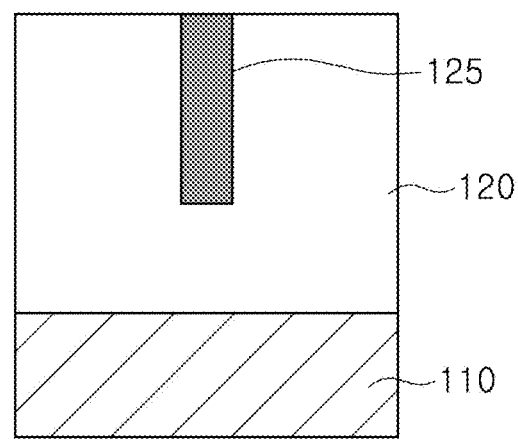

Referring to FIG. 25, an insertion layer material 123 is formed on the resistive layer 120 to fill in the hole H. Referring to FIG. 26, the insertion layer material 123 is planarized to expose the upper surface of the resistive layer 120, forming an insertion layer 125. Then, although not shown in FIG. 26, an upper electrode may be formed on the insertion layer 125 and the resistive layer 120.

A method of fabricating a resistive memory device according to another embodiment will be described with reference to FIGS. 27 to 30.

Figure 27:
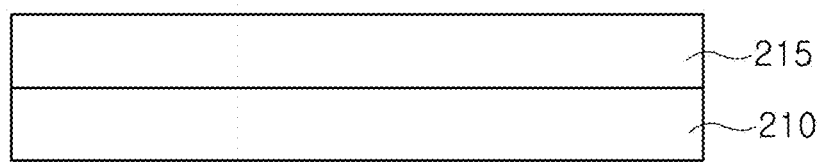
FIGS. 27 to 35 are cross-sectional views illustrating a method of fabricating a resistive memory device according to an embodiment.

Referring to FIG. 27, a first interlayer insulating layer 215 is formed on a semiconductor substrate 210. The first interlayer insulating layer 215 insulates lower electrodes, which will be formed in a subsequent process, from each other. The first interlayer insulating layer 215 may include a silicon nitride layer having good heat-endurance.

Figure 28:
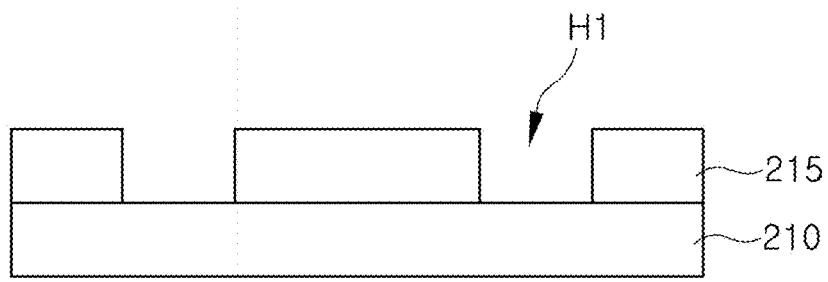

Referring to FIG. 28, a predetermined portion of the first interlayer insulating layer 215 is patterned to form a hole H1. For example, a lower electrode may be formed in the hole H1, to constitute one resistive memory cell.

Figure 29:
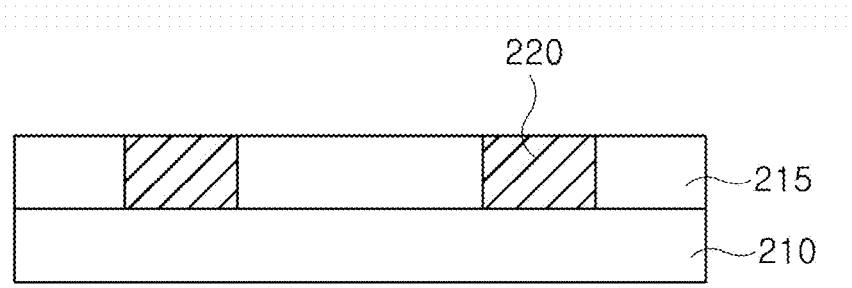

Referring to FIG. 29, a conductive layer fills in the inside of the hole H1 shown in FIG. 28. The conductive layer is planarized to expose the first interlayer insulating layer 215 to form a lower electrode 220 in the hole H1.

Figure 30:
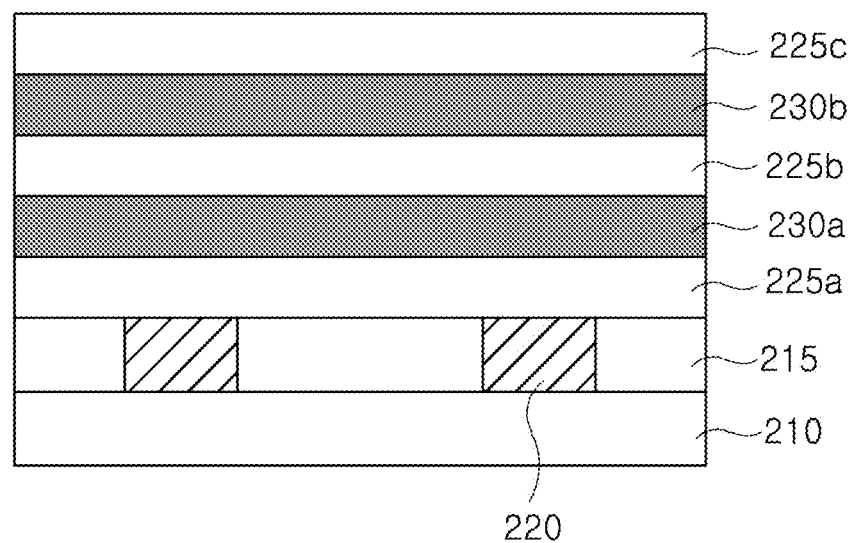

Referring to FIG. 30, an insulating layer and an insertion layer material are alternately stacked on the first interlayer insulating layer 215 in which the lower electrode 220 is formed. The reference numerals 225a to 225c denote a first insulating layer, a second insulating layer, and a third insulating layer, respectively. The reference numerals 230a and 230b denote a first insertion layer material and a second insertion layer material, respectively. The first insertion layer material 230a and the second insertion layer material 230b may have substantially the same resistance value. The first to third insulating layers 225a, 225b, and 225c each may include a silicon oxide layer, a silicon nitride layer, or a silicon oxynitride layer. The first and second insertion layer materials 230a and 230b each may include a conductive layer, a nitride material layer having conductivity, an oxide material layer having conductivity, or a combination thereof. For example, the first and second insertion layer materials 230a and 230b may include AlN, BN, $Al_2O_3$, TaN, W, WN, CoW, NiW, or YiOx, where x is an integer.

Figure 31:
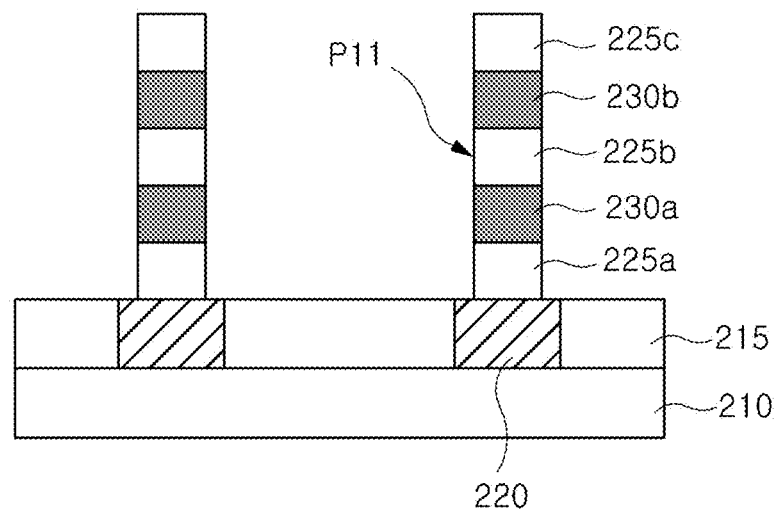

Referring to FIG. 31, a stack including the third insulating layer 225c, the second insertion layer material 230b, the second insulating layer 225b, the first insertion layer material 230a, and the first insulating layer 225a are patterned to form a preliminary resistor structure P11. The preliminary resistor structure P11 may be located on the lower electrode 220. The width of the preliminary resistor structure P11 may be smaller than the width of the lower electrode 220.

Figure 32:
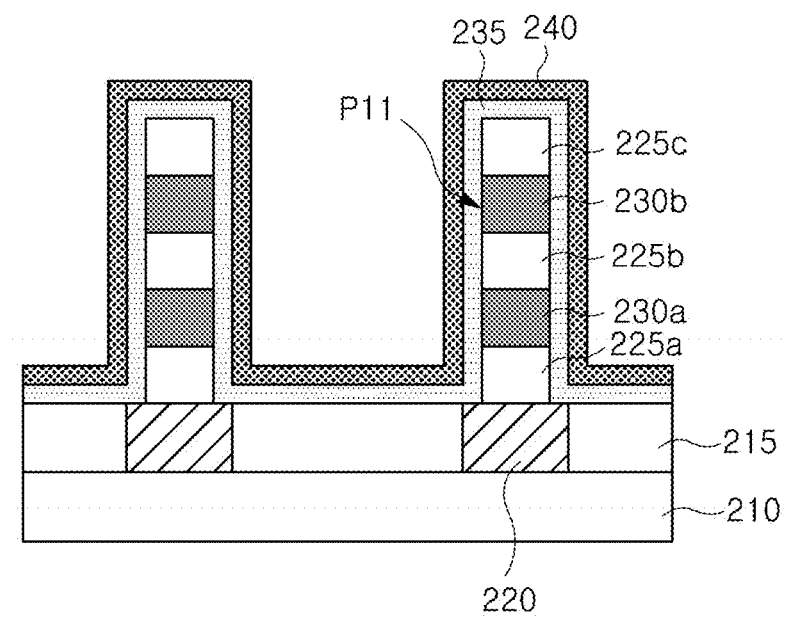

Referring to FIG. 32, a third insertion layer material 235 and a resistive layer material 240 are sequentially formed on the first interlayer insulating layer 215 and the preliminary resistor structure P11. The third insertion layer material 235 and the resistive layer material 240 may be formed with a uniform thickness. For example, the third insertion layer material 235 may be formed to have the same thickness as either the first or second insertion layer materials 230a and 230b. In this case, the third insertion layer material 235 may have a resistance value greater than either the first or second insertion layer materials 230a, 230b. The third insertion layer material 235 may be formed to have a thickness smaller than either the first or second insertion layer materials 230a, 230b. In this case, the first to third insertion layer materials 230a, 230b, and 235 may have substantially the same resistance value. Furthermore, the first to third insertion layer materials 230a, 230b, and 235 may have resistance values substantially smaller than that of the resistive layer material 240 in an amorphous state.

The resistive layer material 240 may include, for example, a PCMO ($Pr_{1-x}Ca_xMnO_3$) layer wherein x is a number of from about 0.05 to about 0.95 (Examples of stoichiometries for PCMO include, but are not limited to, $Pr_{0.7}Ca_{0.3}MnO_3$, $Pr_{0.5}Ca_{0.5}MnO_3$, and $Pr_{0.67}Ca_{0.33}MnO_3$) for a ReRAM, a chalcogenide layer for a PCRAM, a magnetic layer for a MRAM, a magnetization reversal device layer for a STT-MRAM, or a polymer layer for a PoRAM.

Figure 33:
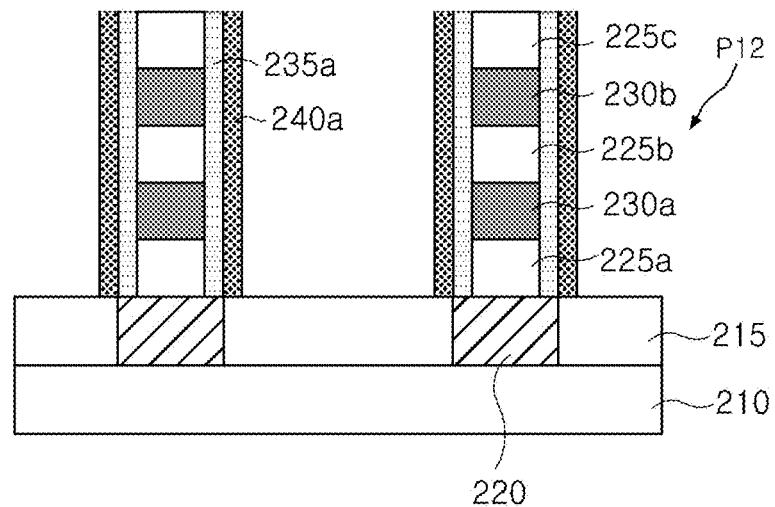

Referring to FIG. 33, the resistive layer material 240 and the third insertion layer material 235 are anisotropically etched to expose the first interlayer insulating layer 215, forming a resistive layer 240a and a third insertion layer 235a each in a spacer shape. As a result, a variable resistor structure P12 is formed on the lower electrode 220.

Figure 34:
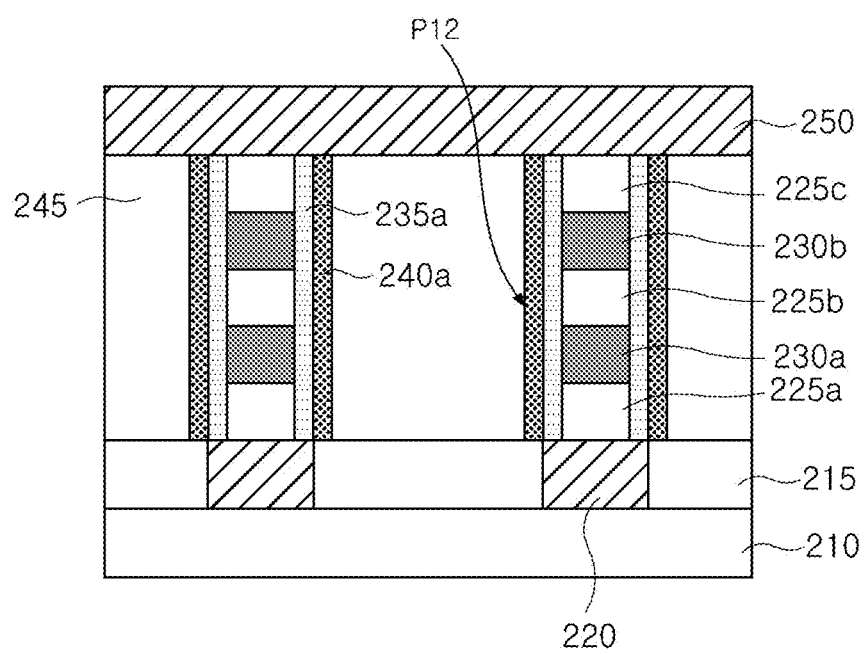

Referring to FIG. 34, a second interlayer insulating layer 245 fills between variable resistor structures P12. The variable resistor structures P12 may be electrically insulated by the second interlayer insulating layer 245. An upper electrode material layer 250 is formed on the second interlayer insulating layer 245 and the variable resistor structure P12. The second interlayer insulating layer 245 may include a silicon nitride layer and it is desirable that the silicon nitride layer has good heat-endurance.

Figure 35:
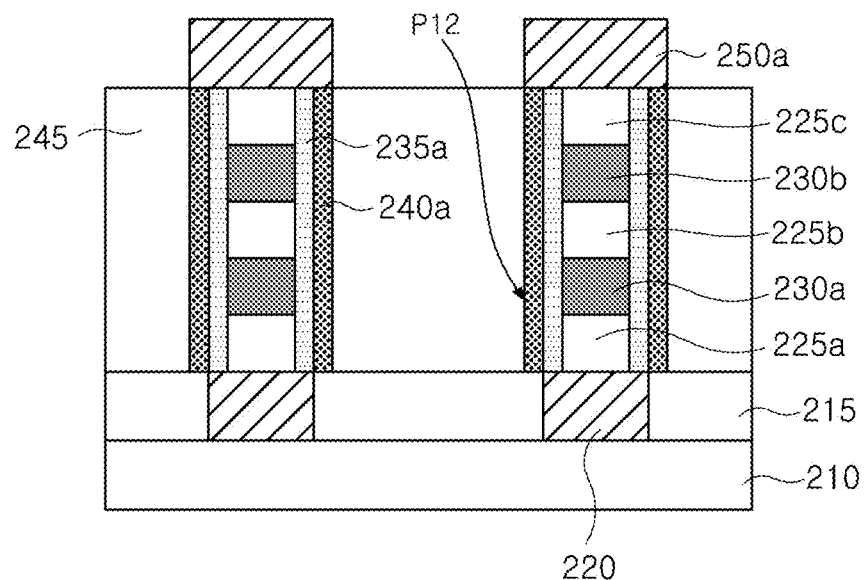

Referring to FIG. 35, the upper electrode material layer 250 is patterned to form an upper electrode 250a.

Figure 36:
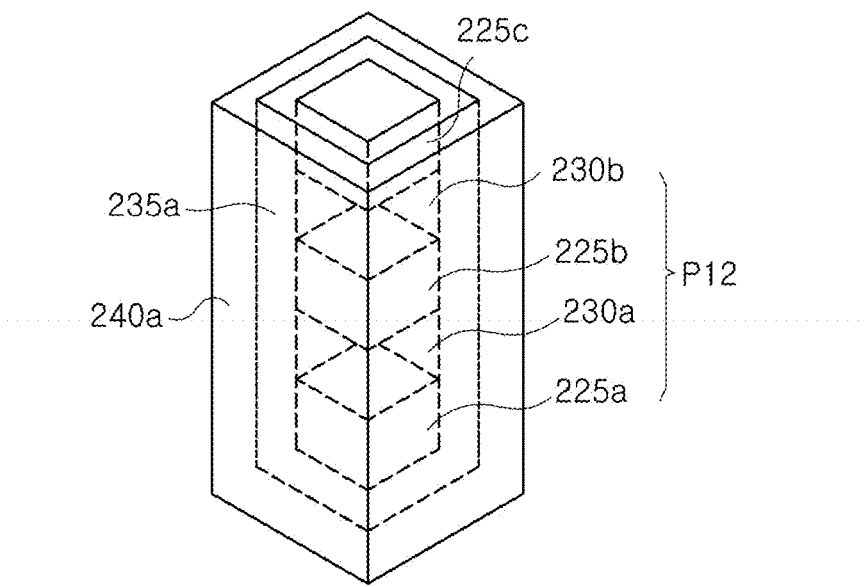
FIG. 36 is a perspective view illustrating a resistive memory device according to an embodiment.

As illustrated in FIG. 36, in the resistive memory device which is substantially in a ring shape, at least one insertion layer 230a, 230b, and 235a is formed inside the resistive layer 240a. A bypass current is formed through the insertion layers 230a, 230b, and 235a in a vertical direction and a horizontal direction. In an embodiment, the insertion layers 230a, 230b, and 235a may include a vertical insertion layer 235a formed in the resistive layer 240a in a cylinder shape, and at least one horizontal insertion layer 230a, 230b extending from a first inner sidewall of the vertical insertion layer 235a to a second inner sidewall of the vertical insertion layer 235a.

Accordingly, when the resistive layer 240a undergoes a phase-change into an amorphous state, current may flow via the bypass path formed through the vertical and/or horizontal insertion layers 235a and/or 230a and 230b which have a relatively small resistance value. Thus, a total effective resistance value of the entire variable resistor structure P12 may be varied. The variable resistor structure P12 may have various resistance values according to the resistor path, and a multi-level memory cell may be realized.

The above embodiments are illustrative and not limitative, that is, the embodiments are not limited to any specific type of semiconductor device.

What is claimed is:

1. A semiconductor integrated circuit device comprising:
 a lower electrode having a flat surface;
 an upper electrode facing the lower electrode;
 a resistive layer formed between the upper electrode and the lower electrode, the resistive layer being changed into an amorphous state or a crystalline state by a voltage applied across the resistive layer;
 cylindrical vertical insertion layer connected between the lower electrode and the upper electrode and formed in the resistive layer;
 a horizontal insertion layer for dividing a space inside the cylindrical vertical insertion layer into two sub-spaces, wherein the horizontal insertion layer contacts an inner wall of the cylindrical vertical insertion layer; and
 an insulation layer formed in the two sub-spaces,
 wherein the cylindrical vertical insertion layer and the horizontal insertion layer have a resistance lower than that of the resistive layer in the amorphous state and higher than that of the resistive layer in the crystalline state.

2. The semiconductor integrated circuit device of claim 1, wherein the resistance of the horizontal insertion layer is the same as the resistance of the cylindrical vertical insertion layer.

3. The semiconductor integrated circuit device of claim 2, wherein a current path from the upper electrode to the lower electrode is generated to detour to the cylindrical vertical insertion layer in place of an amorphous portion of the resistive layer when the amorphous portion of the resistive layer is formed by applying a reset current across the resistive layer.

4. The semiconductor integrated circuit device of claim 1, wherein the resistance of the horizontal insertion layer is lower than the resistance of the cylindrical vertical insertion layer.

5. The semiconductor integrated circuit device of claim 4, wherein a current path from the upper electrode to the lower electrode is generated to detour to the cylindrical vertical insertion layer and the horizontal insertion layer in place of an amorphous portion of the resistive layer when the amorphous portion of the resistive layer is formed by applying a reset current across the resistive layer.

6. The semiconductor integrated circuit device of claim 1, wherein the cylindrical vertical insertion layer has a thickness the same as that of the horizontal insertion layer.

7. The semiconductor integrated circuit device of claim 1, wherein the horizontal insertion layer has a thickness greater than that of the cylindrical vertical insertion layer.

8. The semiconductor integrated circuit device of claim 1, wherein at least one of the cylindrical vertical insertion layer and the horizontal insertion layer comprises aluminum nitride (AlN), boron nitride (BN), alumina ($Al_2O_3$), tantalum nitride (TaN), tungsten (W), tungsten nitride (WN), cobalt tungsten (CoW), nickel tungsten (NiW), yttrium oxide (YiOx), or a combination thereof.

* * * * *